United States Patent
Sun et al.

(10) Patent No.: US 10,714,512 B2
(45) Date of Patent: Jul. 14, 2020

(54) THIN FILM TRANSISTOR, METHOD FOR FABRICATING THE SAME, AND DISPLAY DEVICE

(71) Applicant: BOE Technology Group Co., Ltd., Beijing (CN)

(72) Inventors: Shuang Sun, Beijing (CN); Fangzhen Zhang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/783,461

(22) Filed: Oct. 13, 2017

(65) Prior Publication Data

US 2018/0108688 A1 Apr. 19, 2018

(30) Foreign Application Priority Data

Oct. 14, 2016 (CN) .......................... 2016 1 0899637

(51) Int. Cl.
*H01L 27/12* (2006.01)
*H01L 29/786* (2006.01)
(Continued)

(52) U.S. Cl.
CPC .... *H01L 27/1288* (2013.01); *H01L 21/31116* (2013.01); *H01L 21/32136* (2013.01);
(Continued)

(58) Field of Classification Search
None
See application file for complete search history.

(56) References Cited

U.S. PATENT DOCUMENTS

2014/0061635 A1* 3/2014 Liu ................... H01L 29/66765
257/43
2014/0070239 A1* 3/2014 Yang ..................... G02F 1/1362
257/88
(Continued)

FOREIGN PATENT DOCUMENTS

CN 101995711 A 3/2011
CN 102931139 A 2/2013
(Continued)

OTHER PUBLICATIONS

Chinese Office Action for corresponding Chinese application No. 201610899637.8 dated Jan. 25, 2018.
(Continued)

*Primary Examiner* — Khaja Ahmad
(74) *Attorney, Agent, or Firm* — Arent Fox LLP; Michael Fainberg

(57) ABSTRACT

The disclosure discloses a thin film transistor, a method for fabricating the same, and a display device so as to avoid a source and a drain from being oxidized while the thin film transistor is being fabricated, to thereby improve the performance of the thin film transistor. The method for fabricating a thin film transistor includes: forming an active layer pattern on a base substrate, and a source-drain metal layer located above the active layer pattern and with a same pattern as the active layer pattern, using one patterning process; forming a first insulation layer above the source-drain metal layer; and patterning the source-drain metal layer and the first insulation layer using one patterning process so that portion of the active layer pattern corresponding to a channel area is exposed to form a source pattern and a drain pattern.

19 Claims, 6 Drawing Sheets

(51) Int. Cl.
*H01L 21/311* (2006.01)
*H01L 21/3213* (2006.01)
*H01L 29/66* (2006.01)

(52) U.S. Cl.
CPC .... *H01L 27/1248* (2013.01); *H01L 29/66969* (2013.01); *H01L 29/7869* (2013.01)

(56) References Cited

U.S. PATENT DOCUMENTS

| | | | |
|---|---|---|---|
| 2014/0187001 A1* | 7/2014 | Guo | H01L 29/66765 438/158 |
| 2015/0069378 A1* | 3/2015 | Cha | H01L 27/1225 257/43 |
| 2015/0179812 A1* | 6/2015 | Suzumura | H01L 29/7869 257/43 |
| 2016/0276377 A1* | 9/2016 | Sun | H01L 27/124 |

FOREIGN PATENT DOCUMENTS

| | | | | |
|---|---|---|---|---|
| CN | 105140296 A | 12/2015 | | |
| WO | WO-2015043069 A1 * | 4/2015 | ........... | H01L 27/124 |
| WO | 2017031966 A | 3/2017 | | |

OTHER PUBLICATIONS

Chinese Office Action for corresponding Chinese application No. 201610899637.8 dated Jul. 13, 2017.
Chinese Office Action for corresponding Chinese application No. 201610899637.8 dated Oct. 26, 2017.

\* cited by examiner

THIN FILM TRANSISTOR, METHOD FOR FABRICATING THE SAME, AND DISPLAY DEVICE

CROSS-REFERENCE TO RELATED APPLICATIONS

This application claims the priority to Chinese Patent Application No. 201610899637.8, filed on Oct. 14, 2016, the content of which is hereby incorporated by reference in its entirety.

FIELD

The present disclosure relates to the field of display technologies, and particularly to a thin film transistor, a method for fabricating the same, and a display device.

BACKGROUND

An oxide array substrate is generally formed using seven masks, where a pattern of a gate is formed on a base substrate using a mask 1; a gate insulation layer and an oxide layer are formed using a mask 2, where the material of the oxide is indium gallium zinc oxide (IGZO); patterns of source and drain metal are formed using a mask 3, where a source-drain metal layer is formed on the oxide layer, a source pattern and a drain pattern are formed as a result of first etching using a half tone mask process, and an active layer pattern is formed as a result of second etching; patterns of an insulation layer and a resin layer are formed using a mask 4; a pattern of a common electrode is formed using a mask 5; a pattern of a passivation layer is formed using a mask 6; and a pattern of a pixel electrode is formed using a mask 7, where the pixel electrode is connected with the drain through a via hole running through the passiviation layer, the resin layer, and the insulation layer.

SUMMARY

An embodiment of the disclosure provides a method for fabricating a thin film transistor, the method including: forming an active layer pattern on a base substrate, and a source-drain metal layer located above the active layer pattern and with a same pattern as the active layer pattern, using one patterning process; forming a first insulation layer above the source-drain metal layer; and patterning the source-drain metal layer and the first insulation layer using one patterning process so that portion of the active layer pattern corresponding to a channel area is exposed to form a source pattern and a drain pattern.

Correspondingly an embodiment of the disclosure further provides a thin film transistor including: a base substrate, and a gate, a gate insulation layer, and an active layer stacked on the base substrate, wherein the thin film transistor further includes a source and a drain located above the active layer and electrically connected with the active layer, and a first insulation layer located above the source and the drain, wherein the first insulation layer does not cover a channel area between the source and the drain.

Correspondingly an embodiment of the disclosure further provides a display device including the thin film transistor according to any one of the embodiments above of the disclosure.

DETAILED DESCRIPTION OF THE EMBODIMENTS

Figure 1:
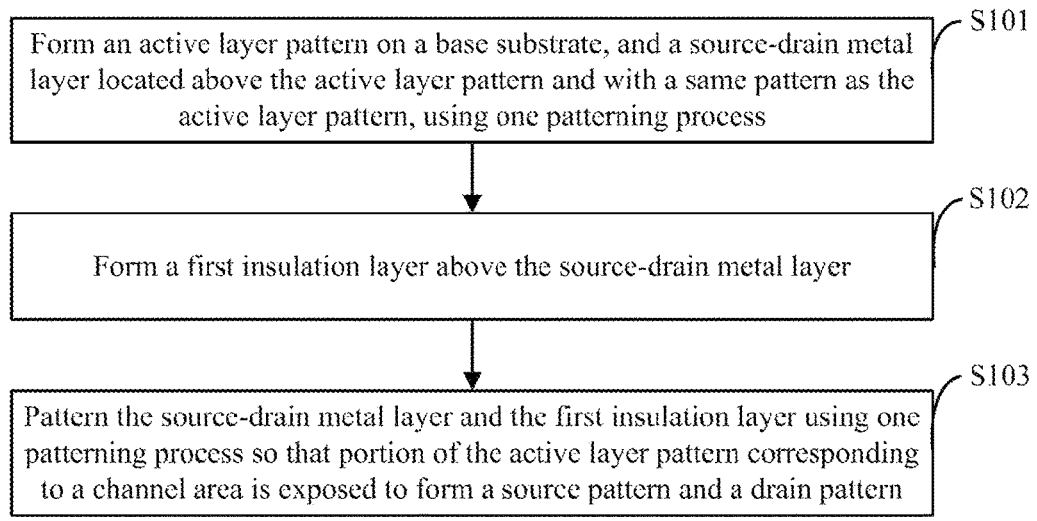
FIG. 1 is a schematic flow chart of a method for fabricating a thin film transistor according to an embodiment of the disclosure.

The source pattern and the drain pattern are formed in the prior art by forming photo-resist on the source-drain metal layer; exposing and developing the photo-resist using the half tone mask to form an entirely-reserved zone for the photoresist, an completely-removed zone for the photoresist, and an entirely-reserved zone for the photoresist, where the entirely-reserved zone for the photoresist corresponds to an area of the source pattern and the drain pattern, the entirely-reserved zone for the photoresist corresponds to a channel area, and the completely-removed zone for the photoresist corresponds to the other area of the source-drain metal layer; removing all the photo-resist in the entirely-reserved zone for the photoresist, and reserving a part of the photo-resist in the entirely-reserved zone for the photoresist, in an ashing process; and etching the source-drain metal layer in the entirely-reserved zone for the photoresist, to form the channel area, where if the source-drain metal layer is etched for the second time after the photo-resist is ashed, then since the source-drain metal layer is typically consisted of two layers MoNb/Cu or three layers MoNb/Cu/MoNb, if the source-drain metal layer is structured in three layers, then MoNb in close contact with the photo-resist may be poorly adhered to the photo-resist so that the photo-resist above the source-drain metal layer may easily peel off, and if the source-drain metal layer is etched, then the source-drain metal layer in the entirely-reserved zone for the photoresist may be easily etched so that the surface of Cu may be oxidized in subsequent plasmas treatment; and if the source-drain metal layer is structured in two layers, then in order to avoid the surface of Cu from being oxidized, no plasma treatment may be performed on the channel area.

In summary, the source and the drain may be easily oxidized while the source pattern and the drain pattern are formed to fabricate the thin film transistor in the prior art, thus degrading the performance of the thin film transistor.

In view of this, the disclosure provides a thin film transistor, a method for fabricating the same, and a display device so as to avoid a source and a drain from being oxidized while the thin film transistor is being fabricated, thereby improving the performance of the thin film transistor.

In order to make the objects, the technical solutions and the advantages of the disclosure more apparent, the disclosure will be further described in details with reference to the drawings. Apparently the described embodiments are only a part but all of the embodiments of the disclosure. Based upon the embodiments of the disclosure here, all of other embodiments derived by those ordinarily skilled in the art without any inventive effort shall come into the scope of the disclosure.

The disclosure provides a thin film transistor, a method for fabricating the same, and a display device so as to avoid a source and a drain from being oxidized while the thin film transistor is being fabricated, to thereby improve the performance of the thin film transistor.

Particular implementations of a thin film transistor, a method for fabricating the same, and a display device according to embodiments of the disclosure will be described below in details.

The thicknesses and shapes of respective film layers in the drawings are not intended to reflect any real proportion, but only intended to illustrate the disclosure of the disclosure.

Referring to FIG. 1, a method for fabricating a thin film transistor according to an embodiment of the disclosure includes the following steps.

The step S101 is to form an active layer pattern on a base substrate, and a source-drain metal layer located above the active layer pattern and with a same pattern as the active layer pattern, using one patterning process;

Where before the active layer pattern is formed on the base substrate, the method further includes forming a gate pattern and a gate insulation layer pattern on the base substrate.

The step S102 is to form a first insulation layer above the source-drain metal layer;

Where the first insulation layer is formed above the entire source-drain metal layer.

The step S103 is to pattern the source-drain metal layer and the first insulation layer using one patterning process so that portion of the active layer pattern corresponding to a channel area is exposed to form a source pattern and a drain pattern.

Where the channel area according to an embodiment of the disclosure refers to an area between the source and the drain after the source pattern and the drain pattern are formed.

In the method for fabricating a thin film transistor according to the embodiment of the disclosure, an active layer pattern on a base substrate, and a source-drain metal layer located above the active layer pattern and with a same pattern as the active layer pattern are formed, using one patterning process; a first insulation layer is formed above the source-drain metal layer; and the source-drain metal layer and the first insulation layer are patterned using one patterning process so that portion of the active layer pattern corresponding to a channel area is exposed to form a source pattern and a drain pattern. Accordingly in the method for fabricating a thin film transistor according to the embodiment of the disclosure, the source-drain metal layer and the first insulation layer are patterned using one patterning process so that the first insulation layer covering the source and the drain is formed while the source pattern and the drain pattern are being formed, to thereby avoid the source and the drain from being oxidized while the source and the drain are being formed, or plasma treatment is being performed on the channel area, thereby improving the performance of the thin film transistor.

In a particular embodiment, in the method for fabricating a thin film transistor according to the embodiment of the disclosure, a mask applied in the patterning process is a mask including only an all-exposed area and an all-shielded area.

Particularly in the embodiment of the disclosure, the source pattern and the drain pattern are formed by patterning the source-drain metal layer, and the first insulation layer located above the source-drain metal layer using one patterning process in which the normal mask including only the all-exposed area and the all-shielded area is applied, to thereby avoid the use of a half tone mask applied to the formation of the source pattern and the drain pattern to fabricate the thin film transistor, so as to dispense with the half tone mask and to save a fabrication cost.

In a particular embodiment, in the method for fabricating a thin film transistor according to the embodiment of the disclosure, the source-drain metal layer and the first insulation layer are patterned using one patterning process so that portion of the active layer pattern corresponding to the channel area is exposed to form the source pattern and the drain pattern in the step S103 by: forming a photo-resist layer above the first insulation layer; exposing and developing the photo-resist layer to form an entirely-reserved zone for the photoresist, and a completely-removed zone for the photoresist, where the completely-removed zone for the photoresist corresponds to the channel area; and etching the first insulation layer and the source-drain metal layer in the completely-removed zone for the photoresist, so that portion of the active layer pattern corresponding to the channel area is exposed to form the source pattern and the drain pattern.

Particularly the photo-resist layer is formed above the first insulation layer, and exposed and developed to form the entirely-reserved zone for the photoresist, and the completely-removed zone for the photoresist, so the photo-resist is formed above the first insulation layer to thereby avoid the photo-resist located above the source-drain metal layer from peeling off in the embodiment of the disclosure; and furthermore the photo-resist is exposed and developed using the normal mask in the embodiment of the disclosure to thereby avoid the photo-resist from being ashed, and dispense with an etching process on the source-drain metal layer, the source-drain metal layer according to the embodiment of the disclosure can be structured in two layers MoNb/Cu or three layers MoNb/Cu/MoNb, and the source-drain metal layer can be avoided from being oxidized in the source-drain metal layer structured in either two or three layers while simplifying the mask, and dispensing with an etching process on the source-drain metal layer, where when the source pattern and the drain pattern are being formed, the entire pattern of the first insulation layer only exposes the channel area.

In a particular embodiment, in the method for fabricating a thin film transistor according to the embodiment of the disclosure, the source-drain metal layer and the first insulation layer are patterned using one patterning process so that portion of the active layer pattern corresponding to the channel area is exposed to form the source pattern and the drain pattern in the step S103 by: forming a photo-resist layer above the first insulation layer; exposing and developing the photo-resist layer to form an entirely-reserved zone for the photoresist, and an completely-removed zone for the photoresist, where the entirely-reserved zone for the photoresist corresponds to an area in which the source pattern and the drain pattern to be formed; and etching the first insulation layer, or the first insulation layer and the source-drain metal layer in the completely-removed zone for the photoresist, so that portion of the active layer pattern corresponding to the channel area is exposed to form the source pattern and the drain pattern.

Particularly the photo-resist layer is formed above the first insulation layer, and exposed and developed to form the entirely-reserved zone for the photoresist, and the completely-removed zone for the photoresist, so the photo-resist is formed above the first insulation layer to thereby avoid the photo-resist located above the source-drain metal layer from peeling off in the embodiment of the disclosure; and furthermore the photo-resist is exposed and developed using the normal mask in the embodiment of the disclosure to thereby avoid the photo-resist from being ashed, and dispense with an etching process on the source-drain metal layer, the source-drain metal layer according to the embodiment of the disclosure can be structured in two layers MoNb/Cu or three layers MoNb/Cu/MoNb, and the source-drain metal layer can be avoided from being oxidized in the source-drain metal layer structured in either two or three layers while simplifying the mask, and dispensing with an etching process on the source-drain metal layer, where when the source pattern and the drain pattern are being formed, the pattern of the first insulation layer is the same as the source pattern and the drain pattern.

In a particular embodiment, in the method for fabricating a thin film transistor according to the embodiment of the disclosure, after the source pattern and the drain pattern are formed, the method further includes: stripping the photo-resist in the entirely-reserved zone for the photoresist.

In a particular embodiment, in the method for fabricating a thin film transistor according to the embodiment of the disclosure, in order to further improve the stability of the thin film transistor, after the photo-resist in the entirely-reserved zone for the photoresist is stripped, the method further includes: performing plasma treatment on portion of the active layer pattern corresponding to the channel area.

Where plasma treatment can be performed on portion of the active layer pattern corresponding to the channel area by supplementing the channel area with $N_2O$. Since there is the first insulation layer formed above the source pattern and the drain pattern while the plasma treatment is performed on the channel area, the source and the drain can be avoided from being oxidized in the treatment on the channel area, so the material of the source and the drain according to the embodiment of the disclosure can be MoNb/Cu or MoNb/Cu/MoNb.

In a particular embodiment, in the method for fabricating a thin film transistor according to the embodiment of the disclosure, after plasma treatment is performed on portion of the active layer pattern corresponding to the channel area, the method further includes: forming a second insulation layer pattern above the first insulation layer.

Particularly all the insulation layers above the source pattern and the drain pattern are formed by depositing them in two layers, so the first insulation layer and the second insulation layer in the embodiment of the disclosure are insulation layers made of the same material at different temperatures, where the temperature of the first insulation layer is higher than the temperature of the second insulation layer.

The method for fabricating a thin film transistor according to the embodiment of the disclosure will be described below in details in connection with particular embodiments thereof.

A method for fabricating a thin film transistor according to an embodiment of the disclosure includes the following steps.

Figure 2A:
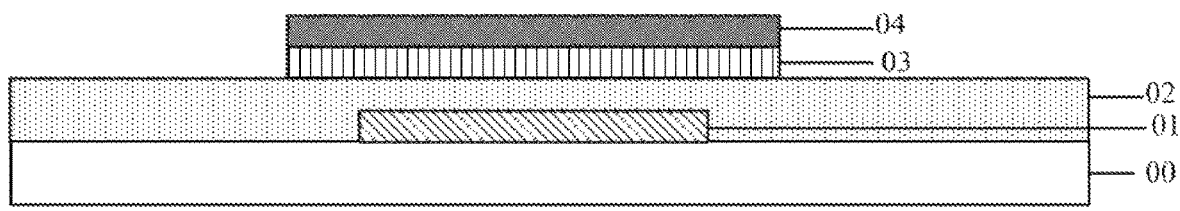
FIG. 2A to FIG. 2F are schematic structural diagrams respectively after respective steps in a method for fabricating a thin film transistor according to a first embodiment are performed.
Figure 2B:
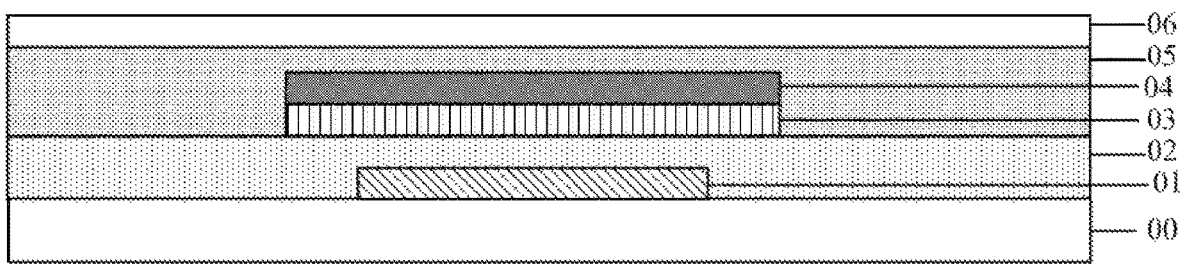
Figure 2C:
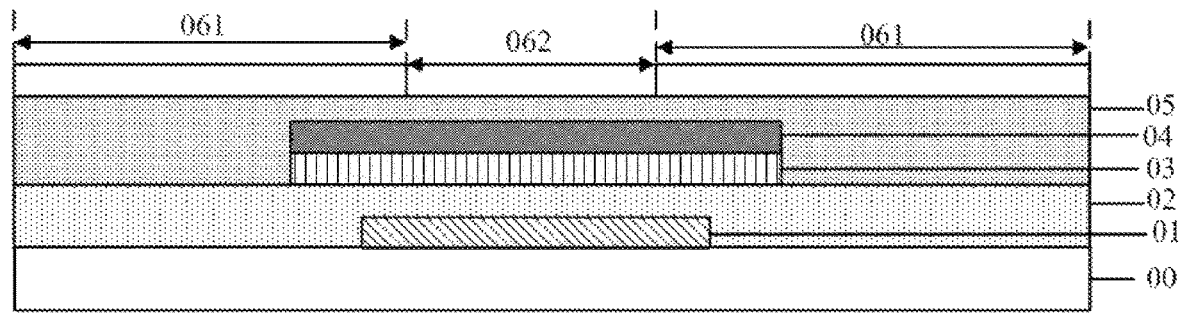
Figure 2D:
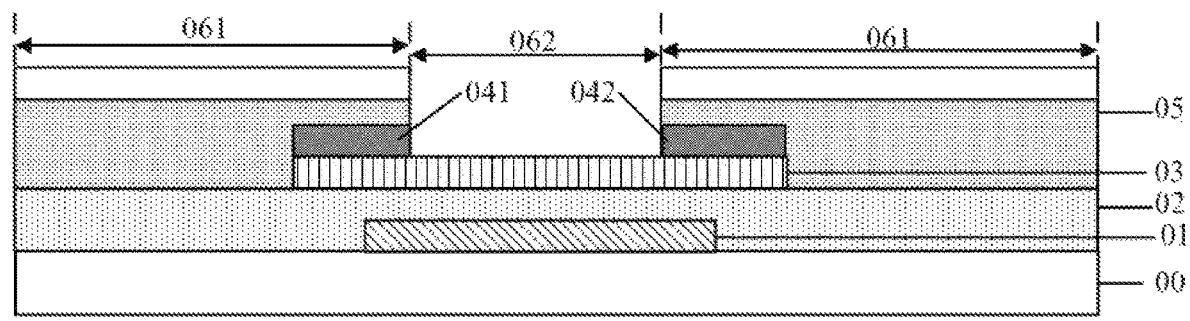
Figure 2E:
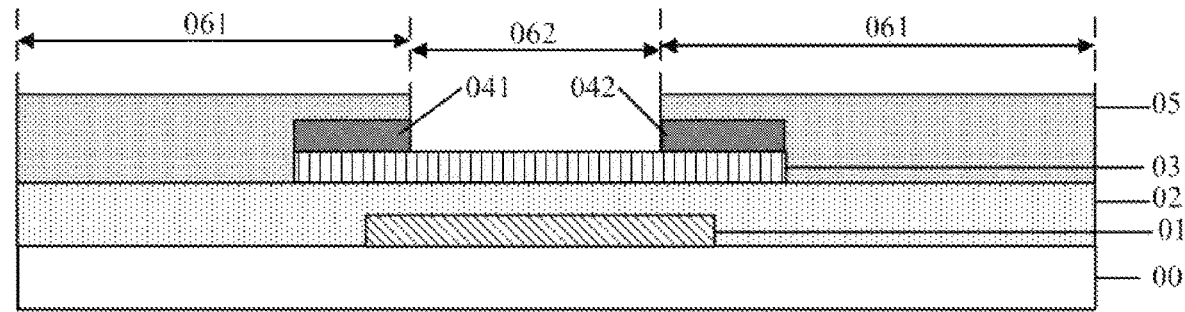
Figure 2F:
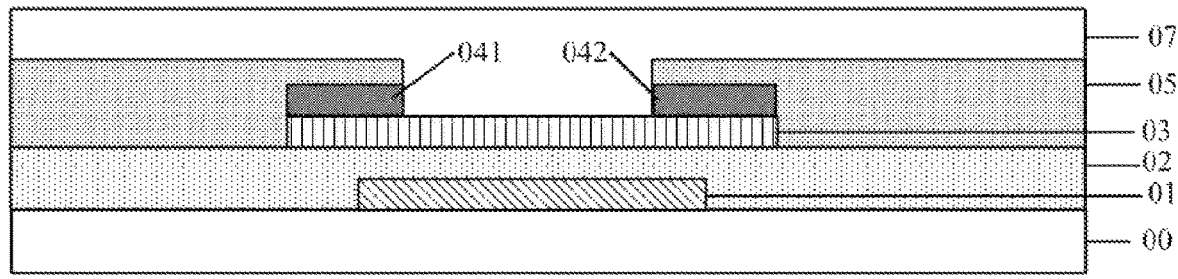

The first step is to form of a gate pattern 01, a gate insulation layer pattern 02, and an active layer pattern 03 on a base substrate 00 in that order, and a source-drain metal layer 04 located above the active layer pattern 03 and with a same pattern as the active layer pattern, as illustrated in FIG. 2A;

The second step is to form a first insulation layer 05 and a photo-resist layer 06 above the source-drain metal layer 04 in that order, as illustrated in FIG. 2B;

The third step is to expose and develop the photo-resist layer 06 to form an entirely-reserved zone for the photoresist 061, and an completely-removed zone for the photoresist 062, where the completely-removed zone for the photoresist 062 corresponds to a channel area, as illustrated in FIG. 2C;

The fourth step is to etch the first insulation layer 05 and the source-drain metal layer 04 in the completely-removed zone for the photoresist 062, so that portion of the active layer pattern corresponding to the channel area is exposed to form a source pattern 041 and a drain pattern 042, as illustrated in FIG. 2D;

The fifth step is to strip the photo-resist in the entirely-reserved zone for the photoresist 061, as illustrated in FIG. 2E; and The sixth step is to perform plasma treatment on portion of the active layer pattern 03 corresponding to the channel area, and then form a second insulation layer pattern 07 above the first insulation layer 05, as illustrated in FIG. 2F.

A method for fabricating a thin film transistor according to an embodiment of the disclosure includes the following steps.

Figure 3A:
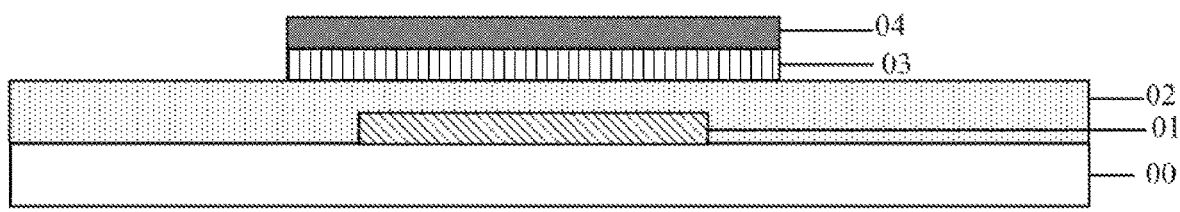
FIG. 3A to FIG. 3F are schematic structural diagrams respectively after respective steps in a method for fabricating a thin film transistor according to a second embodiment are performed.
Figure 3B:
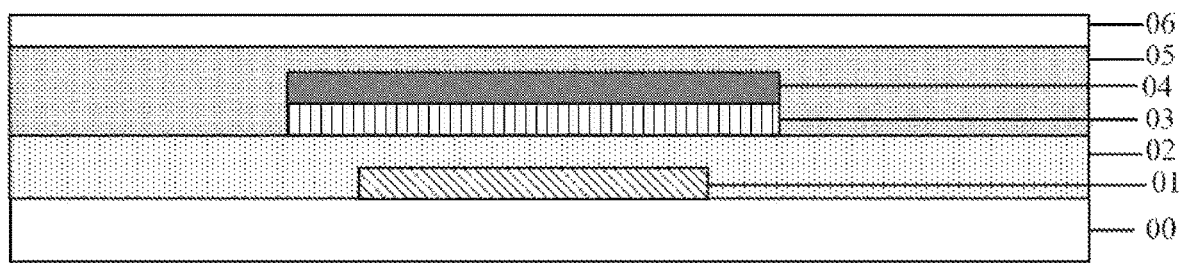
Figure 3C:
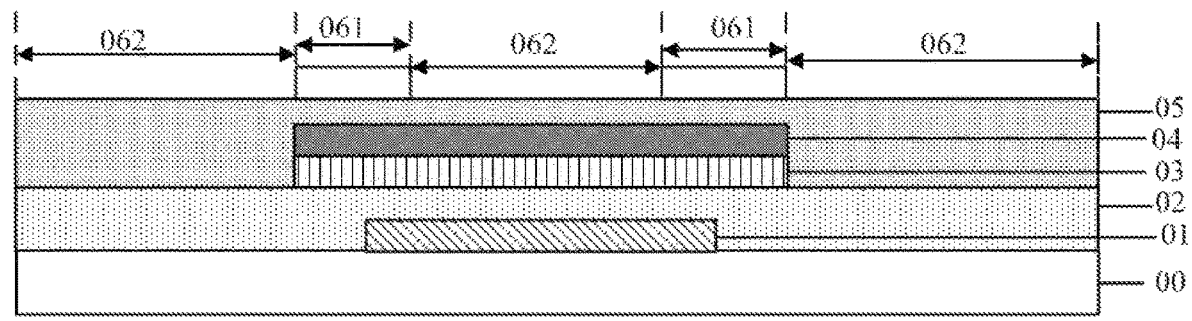
Figure 3D:
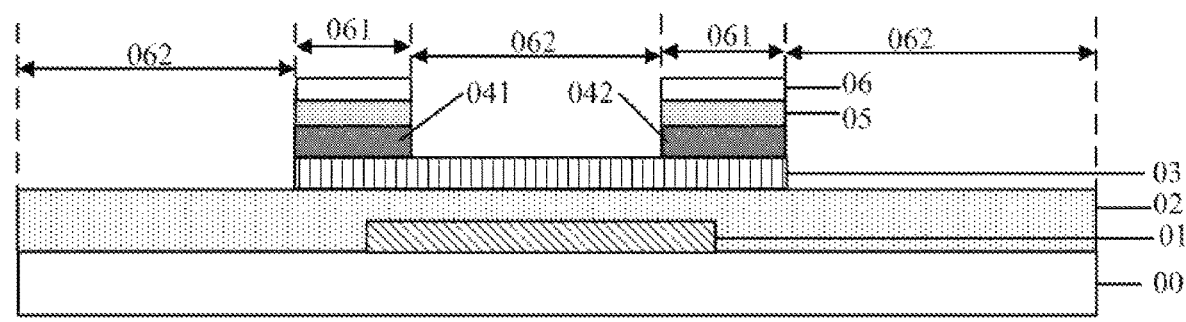
Figure 3E:
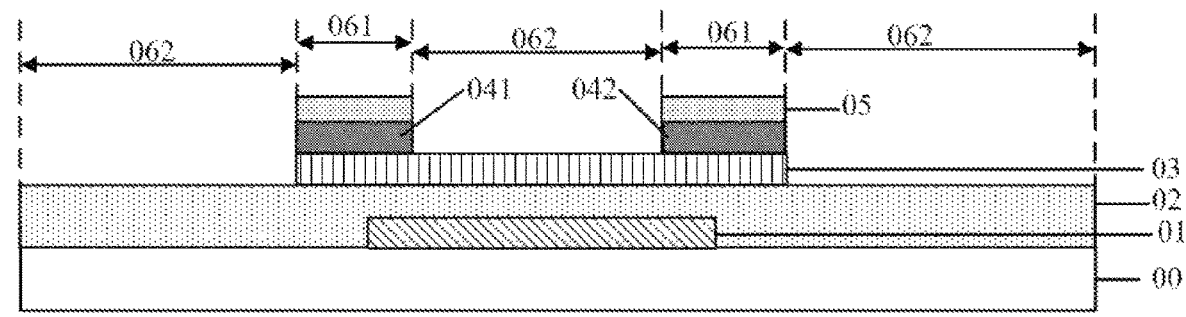
Figure 3F:
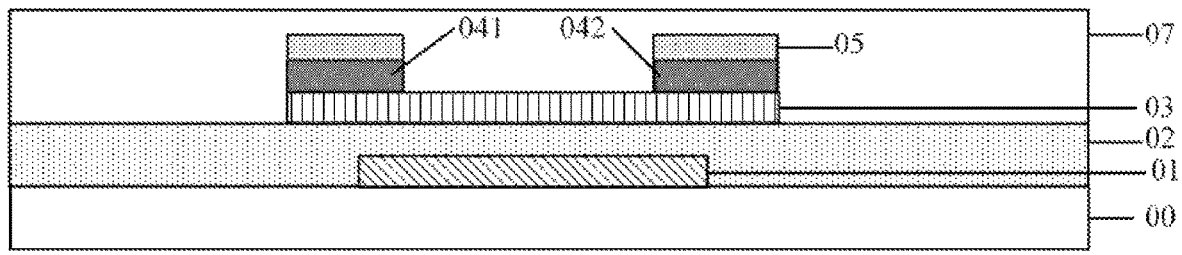

The first step is to form of a gate pattern 01, a gate insulation layer pattern 02, and an active layer pattern 03 on a base substrate 00 in that order, and a source-drain metal layer 04 located above the active layer pattern 03 and with the same pattern as the active layer pattern, as illustrated in FIG. 3A;

The second step is to form a first insulation layer 05 and a photo-resist layer 06 above the source-drain metal layer 04 in that order, as illustrated in FIG. 3B;

The third step is to expose and develop the photo-resist layer 06 to form an entirely-reserved zone for the photoresist 061, and an completely-removed zone for the photoresist 062, where the entirely-reserved zone for the photoresist 061 corresponds to an area in which the source pattern and the drain pattern to be formed, as illustrated in FIG. 3C;

The fourth step is to etch the first insulation layer 05, or the first insulation layer 05 and the source-drain metal layer 04 in the completely-removed zone for the photoresist 062, so that portion of the active layer pattern corresponding to the channel area is exposed to form a source pattern 041 and a drain pattern 042, as illustrated in FIG. 3D;

The fifth step is to strip the photo-resist in the entirely-reserved zone for the photoresist 061, as illustrated in FIG. 3E; and The sixth step is to perform plasma treatment on portion of the active layer pattern 03 corresponding to the channel area, and then form a second insulation layer pattern 07 above the first insulation layer 05, as illustrated in FIG. 3F.

A patterning process needs to be performed on the structures of the respective film layers in the thin film transistor formed in the steps above. The patterning process may include only a photolithography process or may include a photolithography process and an etching step, and also other processes for forming a predetermined pattern such as printing and ink-jetting and; and the photolithography process refers to a process, including film formation, exposure, development, etc., for forming a pattern using photo-resist, a mask, an exposure machine, etc. In a particular implementation, the corresponding patterning process can be selected for the structure to be formed in the embodiment of the disclosure.

Figure 4A:
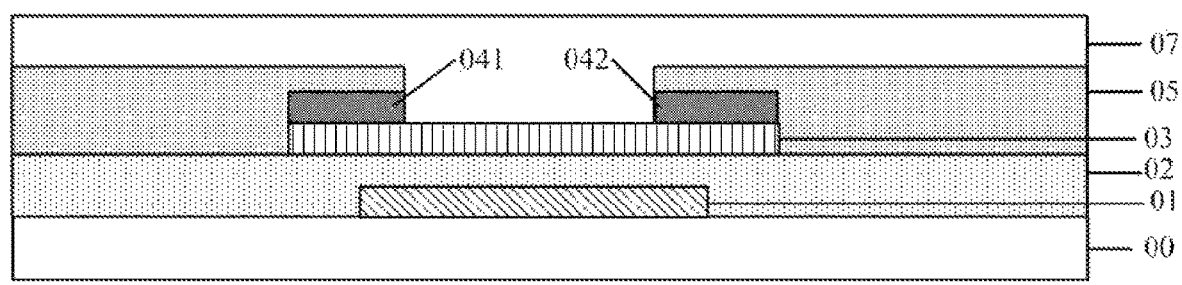
FIG. 4A to FIG. 4B are schematic structural diagrams respectively of a thin film transistor according to an embodiment of the disclosure.
Figure 4B:
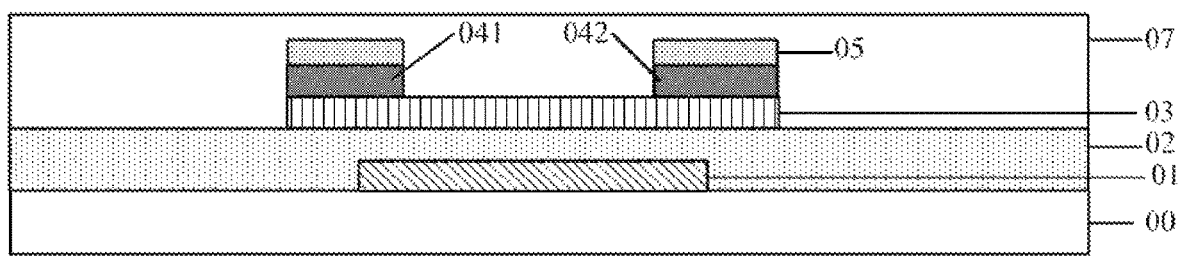

Based upon the same inventive idea, referring to FIG. 4A or FIG. 4B, an embodiment of the disclosure further provides a thin film transistor including a base substrate 00, and a gate 01, a gate insulation layer 02, and an active layer 03 stacked on the base substrate 00; and also a source 041 and a drain 042 located above the active layer 03 and electrically connected with the active layer, and a first insulation layer 05 located above the source and the drain, where the first insulation layer 05 does not cover a channel area between the source and the drain.

Where the first insulation layer of the thin film transistor can be structured to cover the area except the channel area as illustrated in FIG. 4A, or only cover the source and the drain as illustrated in FIG. 4B.

In a particular embodiment, referring to FIG. 4A or FIG. 4B, the thin film transistor further includes a second insulation layer 07 located above the first insulation layer.

It shall be noted that the thin film transistor according to the embodiment of the disclosure can also be fabricated using the method above for fabricating a thin film transistor. Reference can be made to the method above for fabricating a thin film transistor for an embodiment of the thin film transistor, so a repeated description thereof will be omitted here.

An embodiment of the disclosure further provides a display device including the thin film transistor according to the embodiment above of the disclosure.

Figure 5:
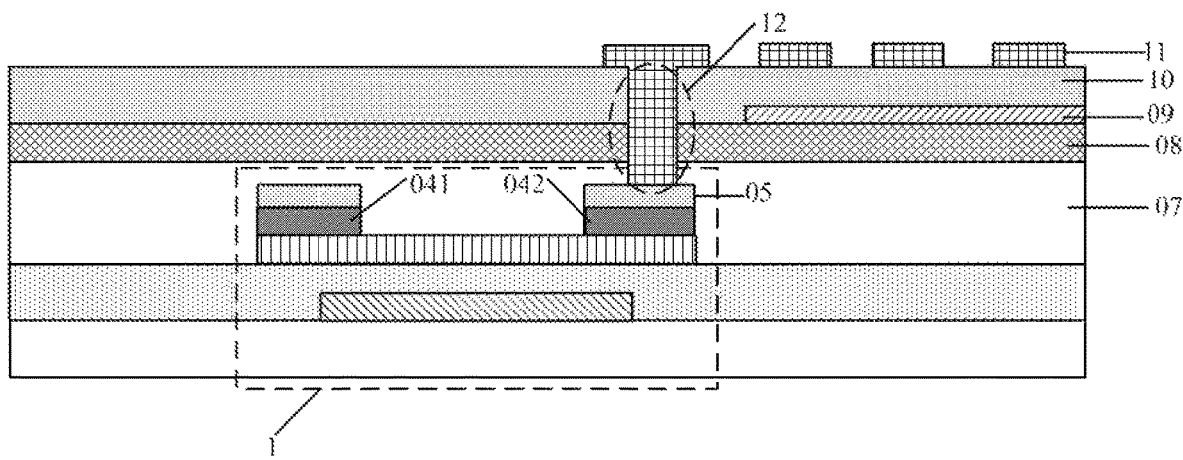
FIG. 5 is a schematic structural diagram of an array substrate according to an embodiment of the disclosure.

Based upon the same inventive idea, referring to FIG. 5, an embodiment of the disclosure further provides an array substrate including a plurality of the thin film transistors 1 according to the embodiment above of the disclosure.

Where the thin film transistors in the array substrate are structured as the thin film transistor as illustrated in FIG. 4A or FIG. 4B.

In a particular embodiment, referring to FIG. 5, the array substrate above according to the embodiment of the disclosure further includes: a flat layer 08, a common electrode layer 09, a passivation layer 10, and a pixel electrode layer 11, stacked above the insulation layer 07, where the passivation layer 10 includes a via hole 12 running through the passivation layer, the flat layer, the first insulation layer, and the second insulation layer to connect the pixel electrode and the drain.

Here the via hole 12 can be formed in shape as a result of etching once after the passivation layer is formed, to thereby further reduce the number of masks, and simplify the masks.

Particularly the array substrate above according to the embodiment of the disclosure can be applicable to a liquid crystal display panel, and also an organic electroluminescent display panel, although the embodiment of the disclosure will not be limited thereto.

If the array substrate above is applied to a liquid crystal display panel, then a pixel electrode may refer to a pixel electrode in the liquid crystal display panel, and if the array substrate above is applied to an organic electroluminescent display panel, then a pixel electrode may refer to a cathode layer or an anode layer in an organic electroluminescent pixel structure.

Based upon the same inventive idea, an embodiment of the disclosure further provides a display device including the display panel according to any one of the embodiments above of the disclosure, where the display device can be a display panel, a mobile phone, a tablet computer, a TV set, a display, a notebook computer, a digital photo frame, a navigator, or any other product or component capable of displaying. Reference can be made to the embodiments of the array substrate above for an implementation of the display device, so a repeated description thereof will be omitted here.

In the thin film transistor, the method for fabricating the same, and the display device according to the embodiments of the disclosure, an active layer pattern on a base substrate, and a source-drain metal layer located above the active layer pattern and with a same pattern as the active layer pattern are formed, using one patterning process; a first insulation layer is formed above the source-drain metal layer; and the source-drain metal layer and the first insulation layer are patterned using one patterning process so that portion of the active layer pattern corresponding to a channel area is exposed to form a source pattern and a drain pattern. Accordingly in the method for fabricating a thin film transistor according to the embodiment of the disclosure, the source-drain metal layer and the first insulation layer are patterned using one patterning process so that the first insulation layer covering the source and the drain is formed while the source pattern and the drain pattern are being formed, to thereby avoid the source and the drain from being oxidized while the source and the drain are being formed, or plasma treatment is being performed on the channel area, thereby improving the performance of the thin film transistor.

Evidently those skilled in the art can make various modifications and variations to the disclosure without departing from the spirit and scope of the disclosure. Accordingly the disclosure is also intended to encompass these modifications and variations thereto so long as the modifications and variations come into the scope of the claims appended to the disclosure and their equivalents.

The invention claimed is:

1. A method for fabricating a thin film transistor, the method comprising:
    forming an active layer pattern on a base substrate, and a source-drain metal layer located above the active layer pattern and with a same pattern as the active layer pattern, using one patterning process;
    forming a first insulation layer on the source-drain metal layer;
    etching the source-drain metal layer and the first insulation layer in a single one etching process so that portion of the active layer pattern corresponding to a channel area is exposed to form a source pattern and a drain pattern, comprising:
    forming a photo-resist layer of a uniform thickness on the first insulation layer; and
    exposing and developing, by a mask applied in the one patterning process, the photo-resist layer to form an entirely-reserved zone for the photoresist, and a completely-removed zone for the photoresist,
    wherein the mask is a mask comprising only an all-exposed area and an all-shielded area.

2. The method according to claim 1, wherein
    the completely-removed zone for the photoresist corresponds to the channel area; and the etching the source-drain metal layer and the first insulation layer in a single one etching process so that portion of the active layer pattern corresponding to the channel area is exposed to form the source pattern and the drain pattern further comprises:
    etching the first insulation layer and the source-drain metal layer in the completely-removed zone for the photoresist, so that portion of the active layer pattern corresponding to the channel area is exposed to form the source pattern and the drain pattern.

3. The method according to claim 1, wherein
    the entirely-reserved zone for the photoresist corresponds to an area in which the source pattern and the drain pattern to be formed; and the etching the source-drain metal layer and the first insulation layer in a single one etching process so that portion of the active layer pattern corresponding to the channel area is exposed to form the source pattern and the drain pattern further comprises:
etching the first insulation layer, or the first insulation layer and the source-drain metal layer in the completely-removed zone for the photoresist, so that portion of the active layer pattern corresponding to the channel area is exposed to form the source pattern and the drain pattern.

4. The method according to claim 2, wherein after forming the source pattern and the drain pattern, the method further comprises:
stripping the photo-resist in the entirely-reserved zone for the photoresist.

5. The method according to claim 4, wherein after the stripping the photo-resist in the entirely-reserved zone for the photoresist, the method further comprises:
performing plasma treatment on portion of the active layer pattern corresponding to the channel area.

6. The method according to claim 5, wherein after the performing plasma treatment on portion of the active layer pattern corresponding to the channel area, the method further comprises:
forming a second insulation layer pattern above the first insulation layer.

7. The method according to claim 3, wherein after forming the source pattern and the drain pattern, the method further comprises:
stripping the photo-resist in the entirely-reserved zone for the photoresist.

8. The method according to claim 7, wherein after the stripping the photo-resist in the entirely-reserved zone for the photoresist, the method further comprises:
performing plasma treatment on portion of the active layer pattern corresponding to the channel area.

9. The method according to claim 8, wherein after the performing plasma treatment on portion of the active layer pattern corresponding to the channel area, the method further comprises:
forming a second insulation layer pattern above the first insulation layer.

10. The method according to claim 1, wherein
the photoresist-completely-removed zone corresponds to the channel area; and the etching the source-drain metal layer and the first insulation layer in a single one process so that portion of the active layer pattern corresponding to the channel area is exposed to form the source pattern and the drain pattern further comprises:
etching the first insulation layer and the source-drain metal layer in the photoresist-completely-removed zone, so that portion of the active layer pattern corresponding to the channel area is exposed to form the source pattern and the drain pattern.

11. The method according to claim 1, wherein
the entirely-reserved zone for the photoresist corresponds to an area in which the source pattern and the drain pattern to be formed; and the etching the source-drain metal layer and the first insulation layer in a single one process so that portion of the active layer pattern corresponding to the channel area is exposed to form the source pattern and the drain pattern further comprises:
etching the first insulation layer, or the first insulation layer and the source-drain metal layer in the completely-removed zone for the photoresist, so that portion of the active layer pattern corresponding to the channel area is exposed to form the source pattern and the drain pattern.

12. The method according to claim 10, wherein after forming the source pattern and the drain pattern, the method further comprises:
stripping the photo-resist in the photoresist-entirely-reserved zone.

13. The method according to claim 12, wherein after the stripping the photo-resist in the photoresist-entirely-reserved zone, the method further comprises:
performing plasma treatment on portion of the active layer pattern corresponding to the channel area.

14. The method according to claim 13, wherein after the performing plasma treatment on portion of the active layer pattern corresponding to the channel area, the method further comprises:
forming a second insulation layer pattern above the first insulation layer.

15. The method according to claim 11, wherein after forming the source pattern and the drain pattern, the method further comprises:
stripping the photo-resist in the entirely-reserved zone for the photoresist.

16. A thin film transistor fabricated by the method of claim 1, the thin film transistor comprising a base substrate, and a gate, a gate insulation layer, and an active layer stacked on the base substrate, wherein the thin film transistor further comprises a source and a drain located above the active layer and electrically connected with the active layer, and a first insulation layer located above the source and the drain, wherein the first insulation layer does not cover a channel area between the source and the drain.

17. The thin film transistor according to claim 16, wherein the thin film transistor further comprises a second insulation layer located above the first insulation layer.

18. A display device, comprising the thin film transistor of the claim 16.

19. The display device according to claim 18, wherein the thin film transistor further comprises a second insulation layer located above the first insulation layer.

* * * * *